United States Patent [19]
Lytle et al.

[11] Patent Number: 5,757,207
[45] Date of Patent: *May 26, 1998

[54] PROGRAMMABLE LOGIC ARRAY INTEGRATED CIRCUIT INCORPORATING A FIRST-IN FIRST-OUT MEMORY

[75] Inventors: Craig S. Lytle, Mountain View; Donald F. Faria, San Jose, both of Calif.

[73] Assignee: Altera Corporation, San Jose, Calif.

[*] Notice: The term of this patent shall not extend beyond the expiration date of Pat. No. 5,572,148.

[21] Appl. No.: 643,809

[22] Filed: May 6, 1996

Related U.S. Application Data

[63] Continuation-in-part of Ser. No. 408,504, Mar. 22, 1995, Pat. No. 5,570,040.

[51] Int. Cl.$^6$ .................................................. H03K 19/177
[52] U.S. Cl. ........................ 326/39; 326/41; 365/230.02
[58] Field of Search ............... 326/38–41; 365/189.02, 365/189.08, 189.12, 230.02

[56] References Cited

U.S. PATENT DOCUMENTS

| Re. 34,444 | 11/1993 | Kaplinsky | 340/825.8 |
|---|---|---|---|
| 4,617,479 | 10/1986 | Hartmann et al. | 307/465 |
| 4,706,216 | 11/1987 | Carter . | |
| 5,260,610 | 11/1993 | Pedersen et al. | 307/465 |
| 5,274,600 | 12/1993 | Ward et al. | 365/221 |
| 5,406,525 | 4/1995 | Nicholes | 365/230.02 |
| 5,572,148 | 11/1996 | Lytle et al. | 326/41 |
| B1 4,617,479 | 9/1993 | Hartmann et al. | 307/465 |

FOREIGN PATENT DOCUMENTS

WO 95/16993  6/1995  WIPO .

OTHER PUBLICATIONS

Nelson, "Embedded Memory Enhances Programmable Logic for Complex, Compact Designs", EDN Magazine, Nov. 7, 1996, pp. 91–106.

Xilinx XC4000, The Programmable Logic Data Book, 1994, pp. 2–7 through 2–46.

MAX 5000, Altera Data Book, Aug. 1993, pp. 149–160.

Lattice Semiconductor Corporation Product News Release, Mar. 4, 1996.

Lattice Semiconductor Corporation Data Sheet, Jan. 1996.

"CPLDs Add Dedicated Memory, Counters To Up Performance", Dave Bursky, Mar. 4, 1996.

Bursky, D. "Combination RAM/PLD Opens New Application Options" (1991) Electronic Design, May 23, 1991, pp. 138–140.

Primary Examiner—Daivd R. Hudspeth
Attorney, Agent, or Firm—Townsend and Townsend and Crew LLP

[57] ABSTRACT

A programmable logic device integrated circuit incorporating a first-in, first-out memory block (250). First-in, first-out memory block (250) is coupled to a programmable interconnect array (213). Signals from the logic array blocks (LABs) (201) are connected to the control inputs of the first-in, first-out memory (250). In one embodiment, the programmable interconnect array (213) may be programmably coupled to the control inputs (259) of the first-in, first-out memory block. Status flag signals (276) from the first-in, first-out memory block (250) are programmably coupled to the programmable interconnect array (213). Data input (263) and data output (261) to first-in, first-out memory block (250) may be coupled to external, off-chip circuitry.

47 Claims, 12 Drawing Sheets

PROGRAMMABLE LOGIC ARRAY INTEGRATED CIRCUIT INCORPORATING A FIRST-IN FIRST-OUT MEMORY

This is a continuation-in-part of application Ser. No. 08/408,504, filed on Mar. 22, 1995 now U.S. Pat. No. 5,570,040.

BACKGROUND OF THE INVENTION

The present invention relates to the field of programmable logic integrated circuits. More specifically, the present invention provides an enhanced programmable logic architecture, improving upon the composition, configuration, and arrangements of logic array blocks and logic elements and also the interconnections between these logic array blocks and logic elements.

Programmable Logic Devices (PLDs) are well known to those in the electronic art. Such programmable logic devices are commonly referred as PALs (Programmable Array Logic), PLAs (Programmable Logic Arrays), FPLAs (Field Programmable Logic Arrays), PLDs (Programmable Logic Devices), EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application. Such devices include, for example, the well-known, Classic™, and MAX® 5000, MAX® 7000, and FLEX® 8000 EPLDs made by Altera Corp.

PLDs are generally known in which many logic array blocks (LABs) are provided in a two-dimensional array. Further, PLDs have an array of intersecting signal conductors for programmably selecting and conducting logic signals to, from, and between the logic array blocks. LABs contain a number of programmable logic elements (LEs) which provide relatively elementary logic functions such as NAND, NOR, and exclusive OR.

Resulting from the continued scaling and shrinking of semiconductor device geometries, which are used to form integrated circuits (also known as "chips"), integrated circuits have progressively become smaller and denser. For programmable logic, it becomes possible to put greater numbers of programmable logic elements onto one integrated circuit. Furthermore, as the number of elements increases, it becomes increasingly important to improve the techniques and architectures used for interconnecting the elements and routing signals between the logic blocks. In particular, it is important to provide enough interconnection resources between the programmable logic elements so that the capabilities of the logical elements can be fully utilized and so that complex logic functions (e.g., requiring the combination of multiple LABs and LEs) can be performed, without providing so much interconnection resources that there is a wasteful excess of this type of resource.

While such devices have met with substantial success, such devices also meet with certain limitations, especially in situations in which the provision of additional or alternative types of interconnections between the logic modules would have benefits sufficient to justify the additional circuitry and programming complexity. Such additional interconnection paths may be desirable for making frequently needed kinds of interconnections, for speeding certain kinds of interconnections, for allowing short distance connections to be made without tying up a more general-purpose interconnection resource such as long-distance interconnect.

There is also a continuing demand for logic devices with larger capacity. This produces a need to implement logic functions more efficiently and to make better use of the portion of the device which is devoted to interconnecting individual logic modules.

As can be seen, an improved programmable logic array integrated circuit architecture is needed, especially an architecture providing additional possibilities for interconnections between the logic modules and improved techniques for organizing and interconnecting the programmable logic elements, including LABs and LEs.

SUMMARY OF THE INVENTION

The present invention is a programmable logic device integrated circuit incorporating a first-in, first-out memory block. First-in, first-out memory block is coupled to a programmable interconnect array. Signals from the logic array blocks (LABs) are connected to the control inputs of the first-in, first-out memory. In an embodiment, the programmable interconnect array may be programmably coupled to the control inputs of the first-in, first-out memory block. Status flag signals from the first-in, first-out memory block are programmably coupled to the programmable interconnect array. Data input and data output to first-in, first-out memory block may be coupled to external, off-chip circuitry.

In particular, the present invention is a programmable logic array integrated circuit including a first plurality of conductors, extending along a first dimension of a two-dimensional array; a second plurality of conductors, extending along a second dimension of the two-dimensional array, where the second plurality of conductors is programmably coupled to said first plurality of conductors; a plurality of logic array blocks, programmably coupled to the first plurality of conductors and second plurality of conductors; and a first-in, first out memory block, programmably coupled to said first plurality of conductors.

In a further embodiment, at least one logic array block of the plurality of logic array blocks is coupled directly, without passing through the second plurality of conductors, to a plurality of control inputs for the first-in, first-out memory block. In a still further embodiment, the first-in, first-out memory block generates a plurality of flag outputs, which indicate the status of the first-in, first-out memory block. This plurality of flag outputs is programmably coupled to the first plurality of conductors.

Other objects, features, and advantages of the present invention will become apparent upon consideration of the following detailed description and the accompanying drawings, in which like reference designations represent like features throughout the figures.

DETAILED DESCRIPTION OF THE PREFERRED EMBODIMENTS

Figure 1:
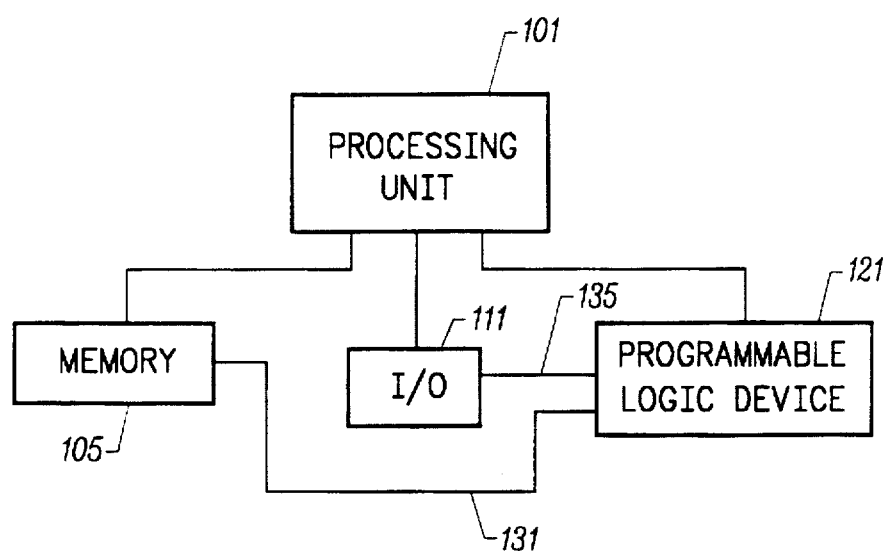
FIG. 1 is a block diagram of a digital system incorporating a programmable logic device integrated circuit.

FIG. 1 shows a block diagram of a digital system within which the present invention may be embodied. In the particular embodiment of FIG. 1, a processing unit 101 is coupled to a memory 105, an I/O 111, and a programmable logic device (PLD) 121. PLD 121 is coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. In some embodiments, processing unit 101 may even be a computer system.

In one embodiment, source code may be stored in memory 105, compiled into machine language, and executed by processing unit 101. In the alternative, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD may serve many different purposes within the system in FIG. 1. PLD 121 may be a logical building block of programmed digital computer 101, supporting its internal and external operations. PLD 121 is programmed to implement the logical functions necessary to carry on its particular role in system operation.

As some examples of the multitude of uses for PLD 121, programmed digital computer 101 may use PLD 121, through connection 131, to decode memory or port addresses for accessing memory 105 or I/O 111. PLD 121 may be programmed to store data like a memory or specialized memory, where this comes from processing unit 101 or memory 105 (via connection 131). PLD 121 may be used as a microcontroller for a memory 105 device such as a fixed or flexible disk drive. PLD 121 may also be configured to be a microcontroller for an I/O 111 device such as a keyboard or scanner, passing data through connection 135.

In other embodiments, PLD 121 may be used as a controller or specialized processing unit such as a coprocessor for performing mathematical or graphical calculations. For example, processing unit 101 would direct data to PLD 121; PLD 121 processes this data; then PLD 121 returns the results to processing unit 101. Furthermore, processing unit 101 may pass or direct a program stored in memory 105 or input using I/O 111 to PLD 121 for execution. These are some of multitude of uses of PLD 121 within a digital system. Also, a system such as the one shown in FIG. 1 may embody a plurality of PLDs 121, each performing different system functions.

The system shown in FIG. 1 may also be used for programming PLD 121 with a particular logic pattern. A computer program for designing functions into a PLD may be stored in memory 105 and executed using processing unit 101. Then, a design characteristic which is to be programmed into PLD 121 is input via I/O 111 and processed by processing unit 101. In the end, processing unit 101 transfers and programs the design characteristic into PLD 121.

In FIG. 1, processing unit 101 is shown directly coupled to PLD 121. However, in other embodiments, a PLD interface may be coupled between processing unit 101 and PLD 121. The PLD interface would provide the proper adapters or sockets for interfacing PLD 121 to processing unit 101. Moreover, the PLD interface would provide the proper voltages and electrical characteristics for coupling PLD 121 to processing unit 101.

Figure 2:
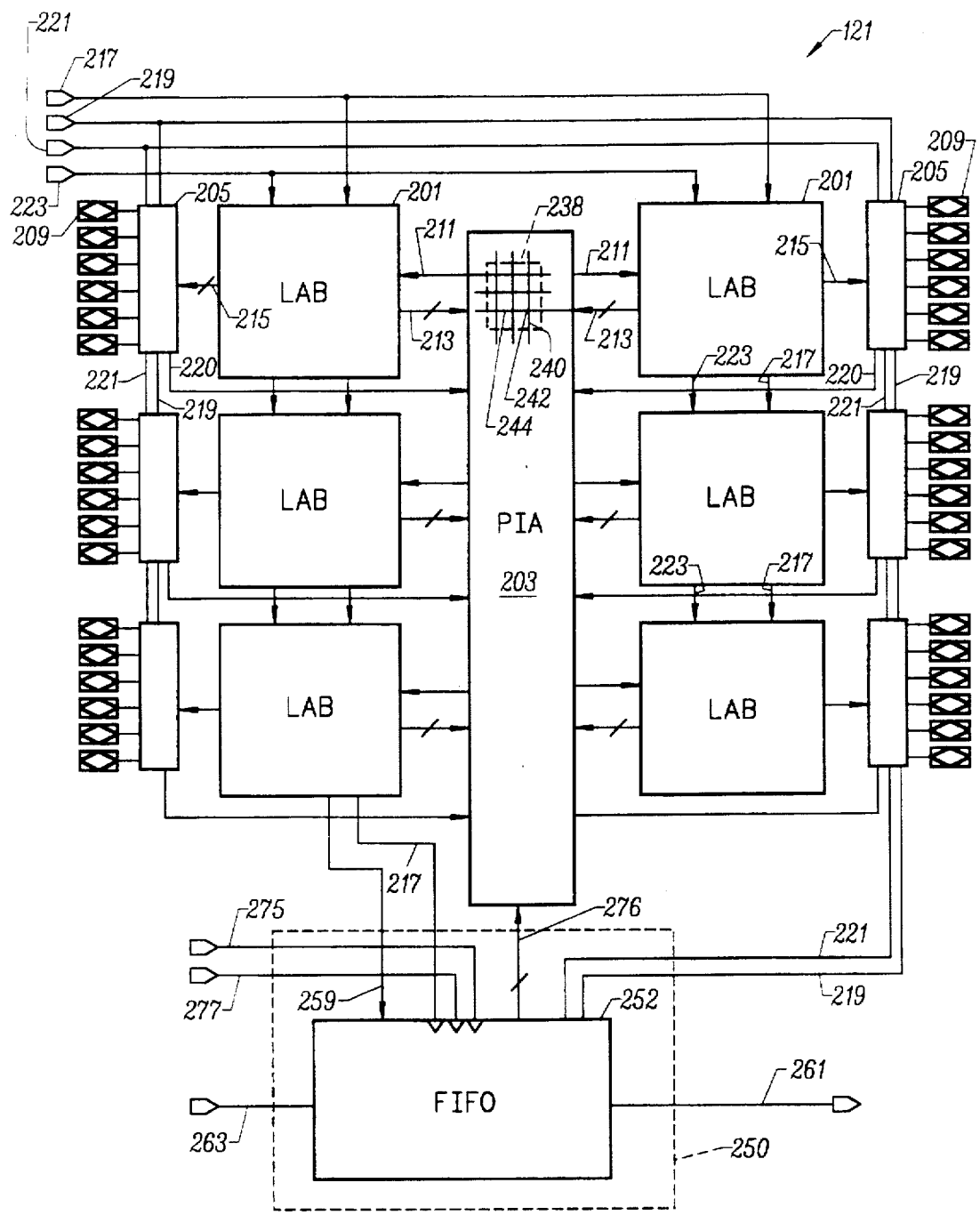
FIG. 2 is a block diagram a programmable logic device integrated circuit of the present invention.

FIG. 2 is a block diagram of the overall internal architecture and organization of PLD 121 of FIG. 1. Many details of PLD architecture, organization, and circuit design are not necessary for an understanding of the present invention and such details are not shown in FIG. 2. PLD 121 includes, among other components, an array of logic array blocks (LABs) 201, a programmable interconnect array (PIA) 203, a first-in, first out memory block 250 (shown in a dashed box), input-output blocks 205, and input-output pads 209.

In the particular embodiment shown in FIG. 2, PLD 121 includes a two-dimensional array of LABs 201, arranged in two columns of three LABs 201 for a total of six LABS. LAB 201 is a physically grouped set of logical resources that is configured or programmed to perform logical functions. The internal architecture of a LAB will be described in more detail below in connection with FIG. 3A. PLDs may contain any arbitrary number of LABs, more or less than PLD 121 shown in FIG. 2. Generally, in the future, as technology advances and improves, programmable logic devices with even greater numbers of LABs will undoubtedly be created. Furthermore, LABs 201 need not be organized as shown in FIG. 2; for example, the array may be organized in a five-by-seven or a twenty-by-seventy matrix of LABs.

LABs 201 are connected to PIA 203 through inputs 211 and outputs 213. PIA 203 is a global interconnect array that facilitates the combination of multiple LABs 201 to form more complex, larger logic functions than can be realized using a single LAB 201. A very simplified view of PIA 203 is provided in dashed box 238. In this embodiment, PIA 203 is a two-dimensional array of conductors for routing signals between different LABs 201. A plurality of horizontal conductors 244 extends in a first direction, coupling to inputs 211 and outputs 213 of LABs 201. A plurality of vertical conductors 240 extends in a second direction, spanning the length of the PLD. The horizontal and vertical conductors are programmably connectable at intersections 242 of these conductors. Using PIA 203, a LAB 201 in one location on the PLD to another LAB 201 in another location on the PLD.

PIA 203 may be implemented using many memory technologies. PIA may be constructed from programmable memory technologies such as, among others, dynamic random access memory (DRAM), static random access memory (SRAM), erasable read only memory (EPROM), fuses, and antifuses. In a specific embodiment, PIA 203 is implemented using electrically erasable programmable read only memory (EEPROM) cells or Flash EEPROM cells.

Figure 3A:
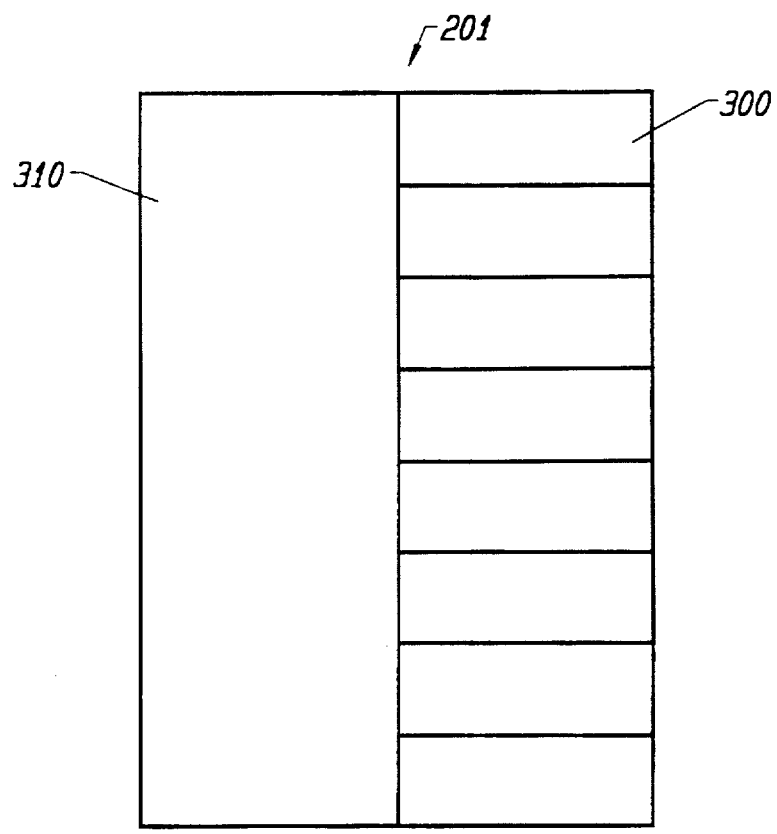
FIG. 3A is a more detailed block diagram of a logic array block of the programmable logic device integrated circuit of FIG. 2.

FIG. 3A shows a simplified block diagram of LAB 201 of FIG. 2. LAB 201 is comprised of a varying number of logic elements (LEs) 300, sometimes referred to as "logic cells," and a local (or internal) interconnect structure 310. LAB 201 has eight LEs 300, but LAB 201 may have any number of LEs, more or less than eight. In a further embodiment of the present invention, LAB 200 has two "banks" of eight LEs for a total of sixteen LEs, where each bank has separate inputs, outputs, control signals, and carry chains.

A general overview of LE 300 is presented here, sufficient to provide a basic understanding of LAB 201 and the present invention. LE 300 is the smallest logical building block of a PLD. Signals external to the LAB, such as from PIA 203 are programmably connected to LE 300 through local interconnect structure 310, although LE 300 may be implemented in many architectures other than those shown in FIGS. 2 and 3A-3F. Furthermore, external signals from dedicated inputs may also be programmably coupled to LE 300.

In one embodiment, LE 300 of the present invention incorporates a logical function generator that is configurable to provide a logical function of a number of variables, such a four-variable Boolean operation. Many other techniques may be used for providing logic functions with LABs and LEs including, but not limited to, function generators, look-up tables, AND-OR arrays, product terms, multiplexers, and a multitude of other techniques. As well as combinatorial functions, LE 300 also provides support for sequential and registered functions using, for example, D flip-flops, T flip-flops, S-R flip-flips, J-K flip-flops, counters, up-down counters, registers, register files, accumulators, and many others.

LE 300 provides combinatorial and registered outputs that are connectable to PIA 203 and input-output blocks 205, outside LAB 201. Through input-output blocks 205, outputs from LE 300 may be coupled to components external to the PLD. Furthermore, in one embodiment, the outputs from LE 300 may be internally fed back into local interconnect structure 310; through local interconnect structure 310, an output from one LE 300 may be programmably connected to the inputs of other LEs 300, without using the global interconnect structure, PIA 203.

Local interconnect structure 310 allows short-distance interconnection of LEs, without utilizing the limited global resources, PIA 203. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

There are many other techniques and architectures for implement logic in a PLD. Such architectures and devices are currently represented by, for example, Altera's MAX® series of PLDs and FLEX® series of PLDs. The former are described in, for example, U.S. Pat. Nos. 5,241,224 and 4,871,930, and the Altera Data Book, March 1995, all incorporated herein by reference. The latter are described in, for example, U.S. Pat. Nos. 5,258,668, 5,260,610, 5,260,611 and 5,436,575, the Altera Data Book, March 1995, and the Flex 8000 Handbook, May 1994, all incorporated herein by reference for all purposes. For example, other embodiments of macrocells and interconnections between PIA 203 and the macrocells are shown in FIGS. 3B to 3F, and other only briefly described here.

Figure 3B:
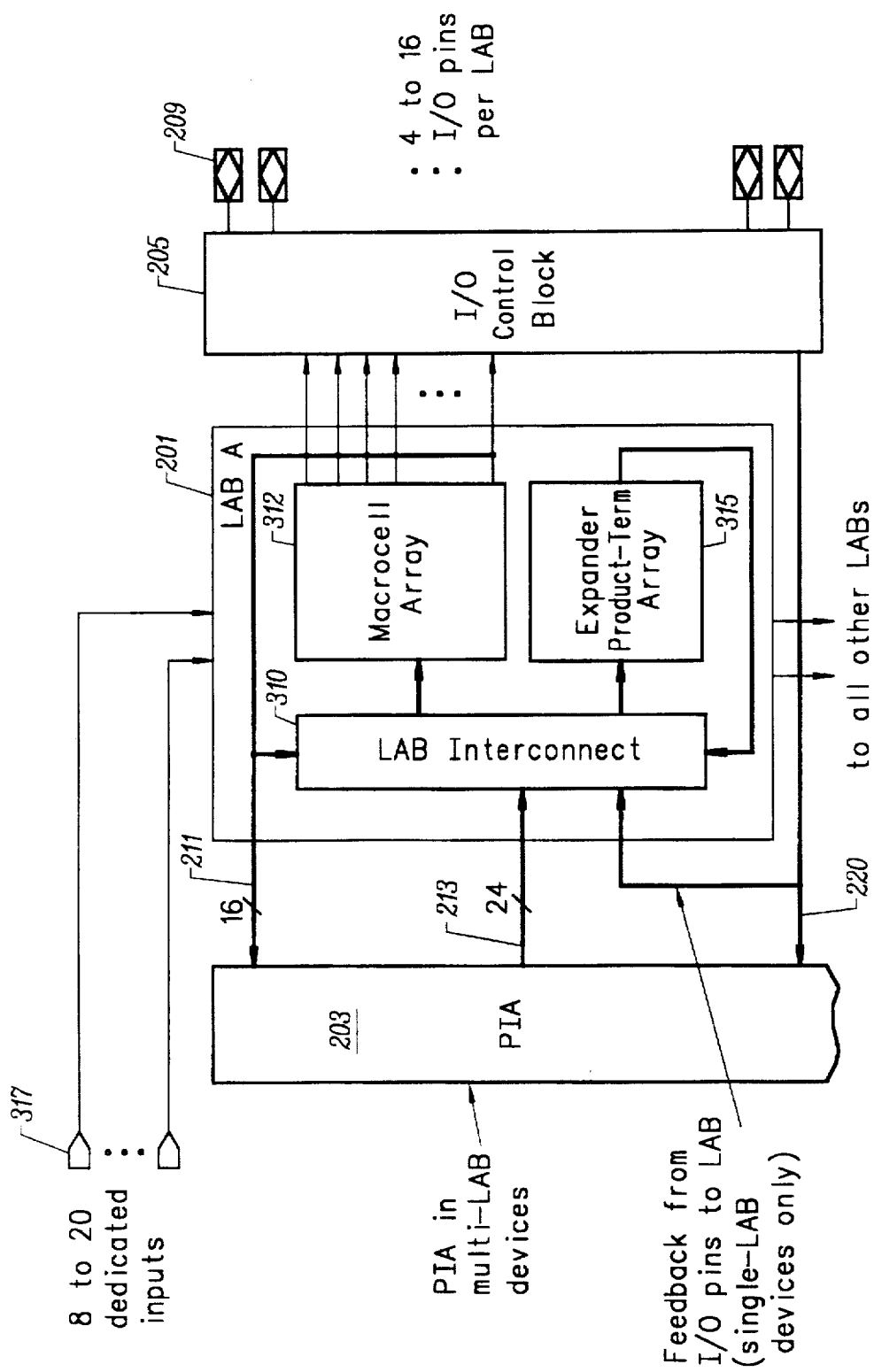
FIG. 3B is a diagram of an embodiment of a logic array block for the programmable integrated circuit of FIG. 2.

LAB 201 of FIG. 3B includes a macrocell array 312, LAB interconnect 310, and expander product-term array 315. FIG. 3B shows the various interconnections between PIA 203 and LAB 201. For example, dedicated inputs 317 input external signals into LAB 201. PIA 213 also inputs signals from other devices coupled to PIA 213 into the LAB. The macrocell 312 is a resource for logic implementation. Additional local capability is available from expanders 315, which can be used to supplement the capabilities of the macrocell 312. The expander product-term array 315 includes a group of unallocated, inverted product terms that can be used and shared by macrocells 312 in LAB 201 to create combinatorial and registered logic. These flexible macrocells 312 and shareable expanders 315 facilitate variable product-term designs without the inflexibility of fixed product term architectures. Macrocell output may be routed via LAB interconnect 310, and also via PIA 203.

Figure 3C:
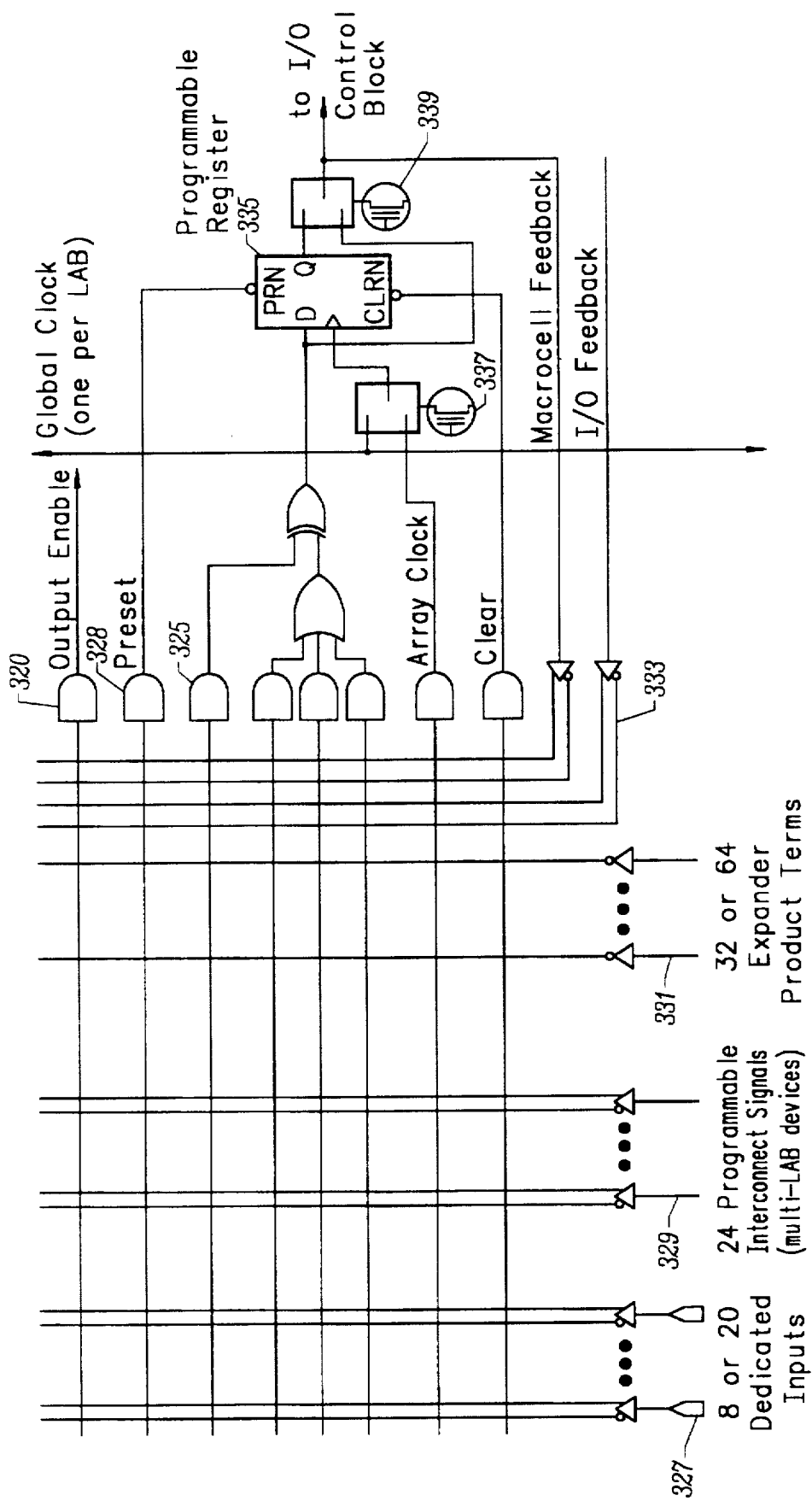
FIG. 3C is a diagram of a macrocell of the logic array block of FIG. 3B.

FIG. 3C shows a macrocell of macrocell array 312 of FIG. 3B. One or more of these macrocells may form macrocell array 312. This is an AND-OR array macrocell. Product terms are provided to programmably implement logical functions. For example, there is an output enable product term 320 and preset product term 323. Other product terms such as product term 325 may be used to implement AND-OR logic. Product terms are programmably configured to AND one or more inputs feeding into the macrocell. For example, in this macrocell, dedicated inputs 327, inputs 329 from PIA 213 (and LAB interconnect 310), and expander inputs 331 from expanders 315 may provide logical inputs for the macrocell. Also, feedback terms 333 feeding back from input-output block 205, as well as from the macrocell itself, may also be used to provide inputs.

This macrocell includes a register 335 for registered logic. A programmable clock multiplexer selects, by way of programmable bit 337, whether register 335 is clocked using an array clock (e.g., from PIA 203) or a global clock. Output from the macrocell is programmably selected by way of programmable bit 339, to select a combinatorial output from an OR gate, or a registered output from register 335.

Figure 3D:
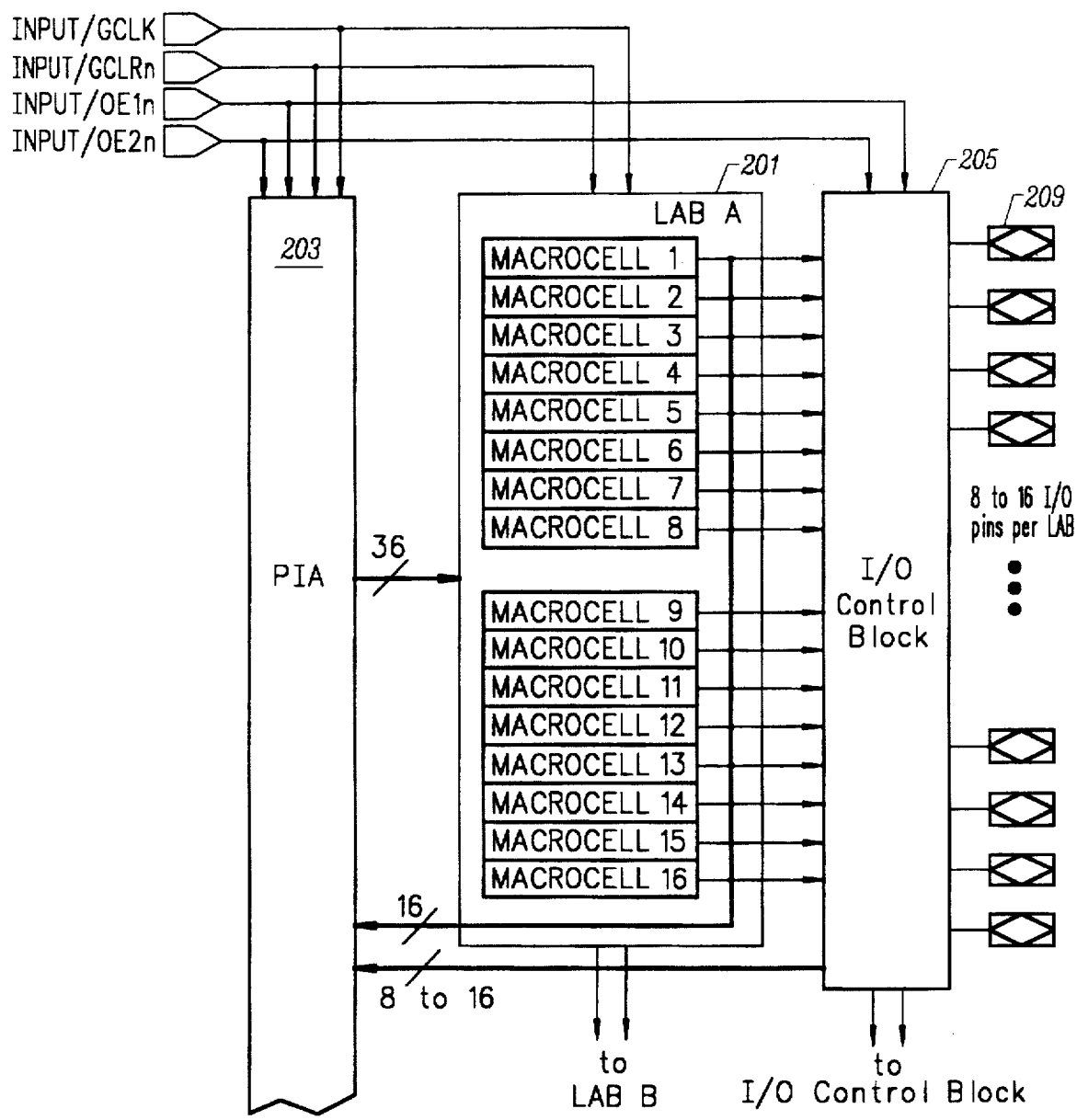
FIG. 3D is a diagram of an embodiment of a logic array block for the programmable integrated circuit of FIG. 2.

FIG. 3D shows another LAB 201 implementation and its interconnections to PIA 201 and other components of the PLD. A GCLK input couples to LAB 201 to provide a global clock signal. A GCLRn input couples to LAB 201 to provide a global clear. An OE1n input and an OE2n input provides global output enable signals to input-output block 205. LAB 201 is comprised of macrocells, an example of which is shown in more detail in FIG. 3E.

Figure 3E:
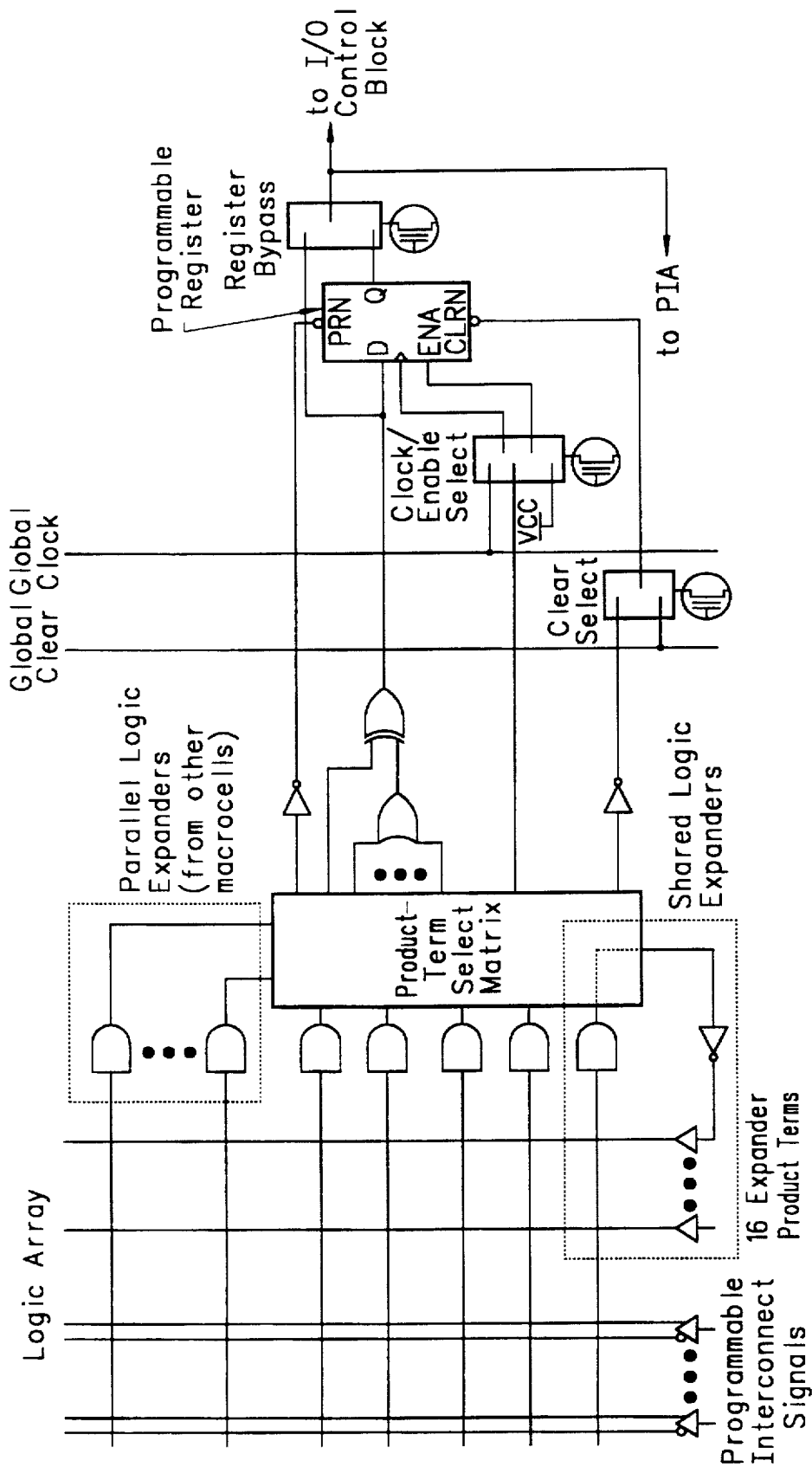
FIG. 3E is a diagram of a macrocell of the logic array block of FIG. 3D.

The macrocell of FIG. 3E is comprised of product terms, a product term select matrix, expander product terms, parallel logic expanders. Further, a programmable register is provided. Clock, enable, and clear inputs of the programmable register may be programmably coupled to inputs determined by programmable multiplexers, controlled by way of programmable bits. Also, combinatorial or registered output from the macrocell may be programmably selected. A further discussion of the details of this macrocell may be found in the previously cited references.

Figure 3F:
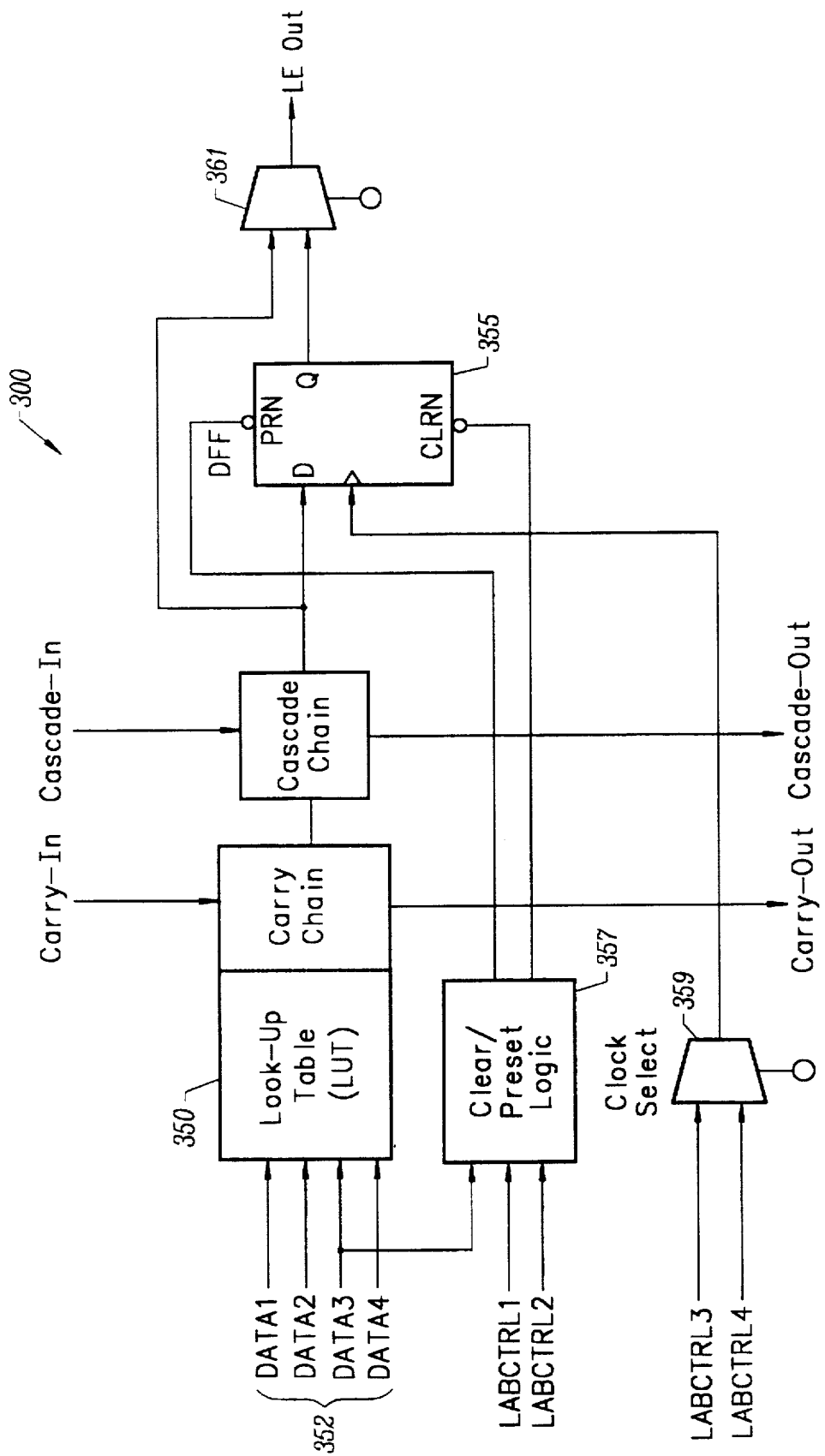
FIG. 3F is a embodiment of a logic element of the logic array block of FIG. 3A.

FIG. 3F shows a logic element (LE) 300 for a LAB 201, such as shown in FIG. 3A. LE 300 includes a look-up table (LUT) 350 which may be programmably configured to implement a function of four variables 452. LUT 350 may be implemented using memories, RAMs, multiplexers, programmable interconnect, AND-OR arrays, combinatorial logic, product terms, and combinations of these, as well as many other techniques.

A carry chain propagates carry signals between LEs 300. A cascade chain also links data between the LEs. Using carry chains and cascade chains, logical functions involving multiple LEs such as counters and registers may be implemented. An output of LUT 350 feeds into a programmable register 355 which provides registered functionality. A clear/preset logic block 357 programmably controls a clear and a preset input of register 355. A clock input to register 355 is programmably selected by a programmable multiplexer 359, controlled by way of a programmable bit. Combinatorial output from LUT 350 or registered output from register 355 may be programmably selected as output for LE 300 using a programmable multiplexer 361, also controlled by way of a programmable bit. From programmable multiplexer 361, the output of LE 300 may be programmably coupled to PIA 203, fed back to LEs 300 in LAB 201, and provide other routing of signals. A further discussion of the details of this macrocell may be found in the previously cited references.

Returning to FIG. 2, global clock signal 217 connects to LABs 201 to allow synchronous and sequential logic operations such as latches, registers, and counters. External, off-chip circuitry may be used to drive the global clock signal 217. Furthermore, a global clear signal 223 connects to LABs 201 to clear latches and registers within LABs 201. External, off-chip circuitry may be used to drive the global clear signal 223.

LABs 201 may output to PIA 203 through connections 213. Connections 213 form a feedback loop from the LAB outputs back into PIA 203 to allow signals one LAB 201 to be passed to the same LAB or other LABs 201. This feedback loop uses PIA 203 resources.

LABs 201 may also output via connections 215 to input-output block 205. Input-output blocks 205 contain circuitry facilitating the connection of outputs 215 from LABs 201 to input-output pads 209 of the PLD. Through input-output blocks 205 and input-output pads 209, output signals from LABs 201 may be interfaced to external, off-chip circuitry. Furthermore, other internal PLD signals may be connected to external, off-chip circuitry by passing them through a LAB 201. Input-output blocks 205 also feedback outputs 215 of LABs 201 to PIA 203 through connections 220. This allows the output 215 of one LAB 201 to be coupled, via PIA 203, to itself or another LAB 201 in the PLD. Multiple LABs 201 may also be combined in this fashion.

In the embodiment shown in FIG. 2, input-output blocks 205 also have an output enable function, where the outputs at input-output pads 209 are enabled or disabled (or tristate). Output enable signals 219 and 221 are global signals, coupled to input-output block 205, for controlling whether specific outputs are enabled or disabled. Input-output block 205 are programmable to determine which input-outputs pads 209 are controlled (enabled or disabled) by which particular output enable signal, 209 or 221.

Furthermore, input-output blocks 205 are also programmably selectable to facilitate the passage of external, off-chip signals to circuitry internal to PLD 121. In this configuration, input-output blocks 205 act as input buffers, taking signals from input-output pads 209 and passing them to PIA 203 through connections 220. From PIA 203, these input signals can be programmably connected to LABs 201. In typical use, a portion of input-output pads 209 will be configured for use for input purposes and a portion will be configured for output purposes.

Figure 3G:
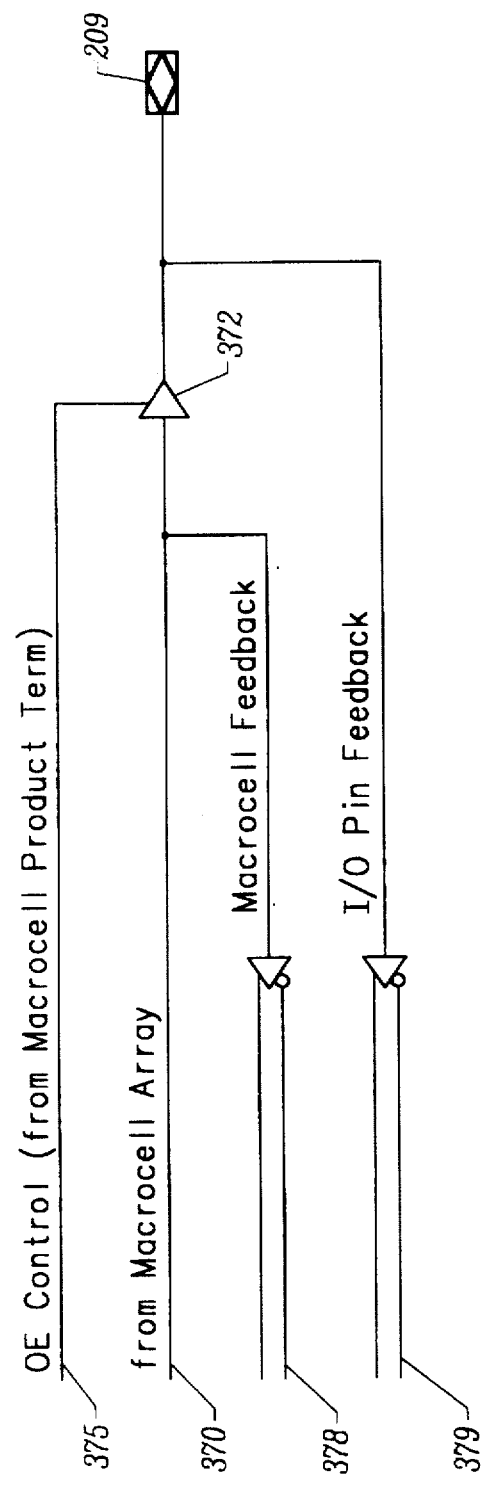
FIG. 3G is a diagram of an I/O control block.

FIG. 3G shows a specific embodiment of circuitry within input-output block 205. This is a I/O control block, one of which may be used with a macrocell or LE 300, or both, of the PLD. An output 370 from a macrocell (or LE 300) is coupled through a tristate buffer 372 to a pad 209. Tristate buffer 372 is controlled using an OE control line 375, which may come from a dedicated OE signal, a macrocell product term, PIA 203, and many other sources. OE control line 375 determines whether tristate buffer 372 is enabled or disabled (i.e., tristated). Output 370 may be fed back to LAB 201, PIA 203, and other PLD resources via lines 378, and may also be fed back via lines 379. Tristate buffer 372 may be tristated, and lines 379 may be used to input data from pad 209 into the PLD.

Figure 3H:
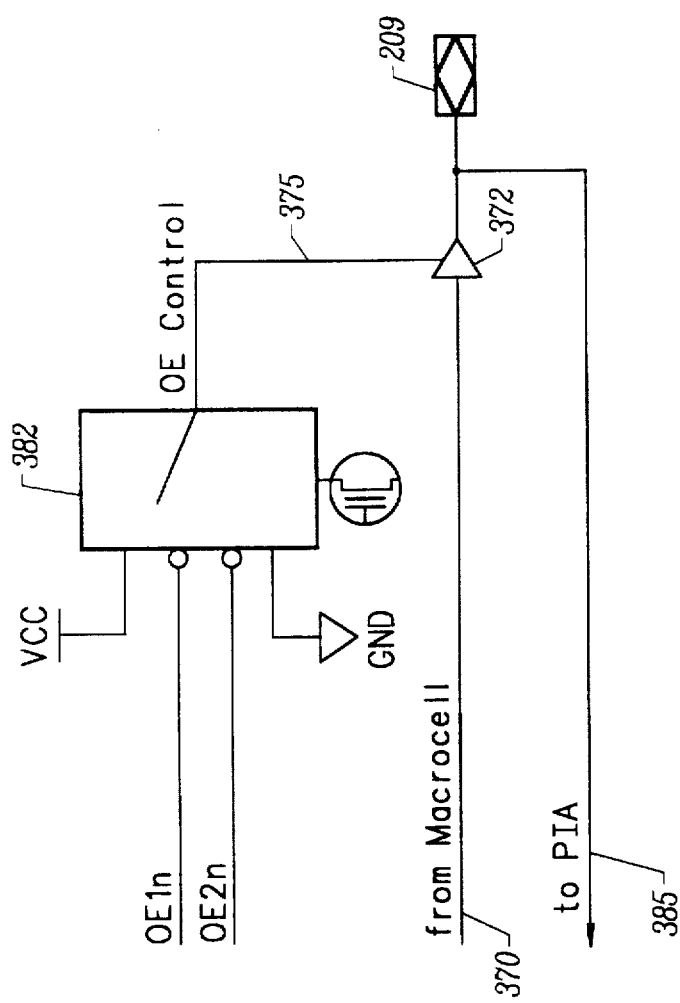
FIG. 3H is an embodiment of an I/O control block having a programmable multiplexer for controlling an output enable control line.

FIG. 3H is a further specific embodiment of circuitry within input-output block 205. This circuitry is somewhat similar to that in FIG. 3G. An output 370 from a macrocell (or LE 300) is coupled through a tristate buffer 372 to a pad 209. Tristate buffer 372 is controlled using an OE control line 375, which may be coupled to a variety of sources using a programmable multiplexer 382 (controlled by way of a programmable bit). Tristate buffer 375 may be continuously enabled by programmably coupling OE control line 375 to VDD. Tristate buffer 375 may be continuously disabled by programmably coupling OE control line 375 to VSS. Tristate buffer 375 may also be controlled by OEb 1n or OE2n inputs.

Output 370 may be fed back to LAB 201, PIA 203, and other PLD resources via line 385. Tristate buffer 372 may be tristated, and line 385 may be used to input data from pad 209 into the PLD.

Returning to FIG. 2, first-in, first-out memory block 250 includes a FIFO block 252. FIFO 252 is a first-in, first-out memory and associated logic for storing and retrieving data. In particular, data are stored in FIFO 252 in a FIFO memory organization. In FIFO mode, data are stored in and retrieved from the RAM in a first-in, first-out fashion. More specifically, data are retrieved from a FIFO memory in exactly the same order data were stored, like a queue—the first item in is also the first item out. Therefore, PLD 121 is programmably configurable to include a FIFO memory and can perform logical function using this type of memory. A more detailed description of FIFO 252 is given below in the discussion of FIG. 5.

FIFO 252 of FIG. 2 is dual ported; data may be input, output, and addressed using separate lines. Specifically, data is input and stored into FIFO 252 through data input 263. Through data input 263, external off-chip circuitry may interface with and load FIFO 252 with data. In further embodiments of the present invention, data input 263 may come from components within PLD 121 such as LABs 201 and, PIA 203.

Data retrieved from FIFO 252 is output through data output 261. Data output 261 may interface with and drive external, off-chip circuitry. External, off-chip circuitry can use this FIFO 252 output data for performing off-chip logical functions. Furthermore, in one embodiment, output 261 may be tristated, based on global output enable signals 219 and 221 (described below). When enabled, output data is produced at output 261. When disabled, output data is not produced at output 261; instead, output 261 will be in a high-impedance state. This feature allows output 261 to be connected to a bidirectional bus, such as a microprocessor's input and output lines.

In further embodiments, FIFO 252 may also have a data output which is connected to PIA 203. Through PIA 203, data stored in FIFO 252 may be passed to and used by other components within PLD 121, including LABs 201. For example, a sequential state machine can be designed using LABs 201 and FIFO 252. Based on its inputs, LABs 201 determine the current state of the state machine and provide FIFO 252 with the proper memory address for this state. Based on this address, FIFO 252 provides the boolean outputs for this particular state, as well as pointers to the next possible states in the state machine. LABs 201 use these pointers, accessible via a FIFO data output connected to PIA 203, and determines the next state for the state machine.

In the embodiment of FIG. 2, output data from FIFO 252 may be used by LABs 201 by feeding these outputs back into PLD 121 through input-output pads 209. However, an internal connection from FIFO 252 to PIA 203, as described above, avoids the delays and overhead associated with going through input-output pads 209, input-output blocks 205, and other similar circuits.

In FIG. 2, a LAB 201 is directly connected to a control signal input 259 of FIFO 252. However, in other embodiments of the present invention, control signal input 259 may be programmably connected to PIA 203 or an LE 300. Furthermore, in other embodiments of the present invention, control signal input 259 may be programmably connected to a LABs 201 through PIA 203. But, a direct connection from a LAB 201 to control signal input 259 (as shown in FIG. 2) avoids PIA-associated delays and overhead along this path. Further discussion of the various types of connections for control signal input 259 of the present invention accompanies the discussion of FIGS. 4A–4D.

Control signal input 259 governs the reading, writing, clocking, clearing, resetting, enabling, output enable, and other similar operations of FIFO 252. Control signal input 259 may contain a plurality of control signals. In one embodiment, control signal input 259 includes five control signals, described further below. Through PIA 203, LABs 201 are programmable connectable to control signal input 259 to direct FIFO 252 operations. For example, one LAB 201 may be configured to enable writing of data into FIFO 252 upon the occurrence of certain logic conditions. A more detailed description of control signal input 259 accompanies the discussion of FIG. 5 below.

FIFO 252 generates flag signal 276, which is connected to PIA 203. FIFO 252 uses flag signal 276 to provides status information of FIFO 252 for other components within PLD 121. For example, flag signal 276 may indicate whether FIFO 252 is full, which means that no memory locations are available for storing data. This flag signal 276 may be connected through PIA 203 to a LAB 201, which will disable writing of data into FIFO 252 when FIFO 252 is full. Flag signal 276 may be a plurality of flag signals, where each flag signals indicates a different condition. In one embodiment, there are four flag signals. A more detailed description of these flag signals accompanies the discussion of FIG. 5 below.

Three clock inputs, global clock signal 217, MEMCLK0 275, and MEMCLK1 277, may be programmably selected for controlling the clocking of data into FIFO 252. Global clock signal 217 is global signal which is programmably connected to LABs 201 as well as FIFO 252. For example, global clock signal 217 may be used to synchronize particular LABs 201 and FIFO 252 operations. External, off-chip circuitry may be programmably selected to control the clocking of FIFO 252 through dedicated clock inputs MEMCLK0 275 and MEMCLK1 277. A further discussion of the clocking of FIFO 252 is given below.

Two global output enable signals, 219 and 221, are coupled to FIFO 252 and control whether output 261 is tristated or enabled. As discussed previously, global output enable signals 219 and 221 are also coupled to input-output blocks 205 for controlling the output enable feature of these blocks.

The programmable integrated circuit of the present invention is useful in many applications such as communications, networks, digital video, digital telephony, multimedia, and many others, where the FIFO performs as a specialty high-speed buffer. Furthermore, in a preferred embodiment, the programmable integrated circuit is controlled by way of programmable cells, such as EEPROM or Flash cells, which may be programmably configured using in-system programming (ISP). ISP programming is a technique where the programmable resources of a programmable integrated circuit are configured (programmed or erased) while resident in the system. Specifically, the programmable integrated circuit need not be removed from the circuit board and configured using an apparatus specially designed for programming such integrated circuits (e.g., Data I/O programmer). ISP programming allows greater flexibility when reprogramming programmable circuits. For example, the configuration information in a programmable circuit may be updated or modified as needed, and as many times as needed (even "on-the-fly" during system operation), without requiring the removal and installation of components, or disassembly of the system. The configuration will also be nonvolatile, which means that the stored information is retained even when power is removed.

FIGS. 4A–4D are block diagrams of various types of connections or connection paths between LE 300 and FIFO 252 and PIA 203 and FIFO 252. In the embodiment shown in FIG. 4A, an LE 300 of a LAB 201 is programmably connectable to the control (259), data (263), or address (265) inputs of FIFO 252. There are one or more programmable direct connections 405 to control (259), data (263), and address (265) lines of FIFO 252. One advantage of this connection path is that directly connecting LE 300 to FIFO 252 bypasses PIA 203, thus avoiding PIA-associated delays.

The control, data, and address inputs to FIFO 252 include those described above, and will be described in more detail below. Furthermore, control inputs may include, for example, inputs for write enable, read enable, clock, strobe, output enable. Data inputs of FIFO 252 may be used to input data into FIFO 252. These may be coupled to data input 263. For example, data from a LAB 201 may be coupled to and stored in FIFO 252. Address inputs of FIFO 252 are used for controlling the addresses of FIFO 252. For example, by controlling the addressing of FIFO 252, a LAB 201 may specifically customize the operation of FIFO 252 to a particular application.

Figure 4A:
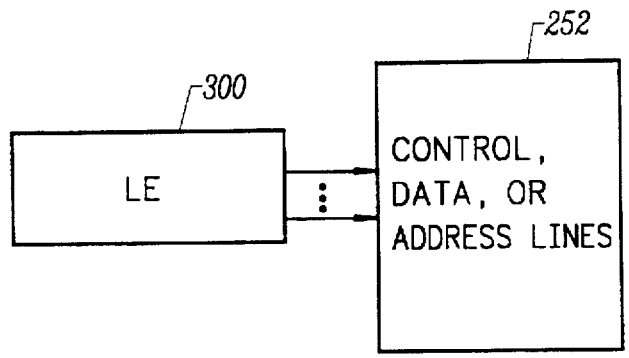
FIG. 4A is a diagram showing interconnections between a logic element of a logic array block and a first-in, first-out memory block of the programmable logic device integrated circuit.
Figure 4B:
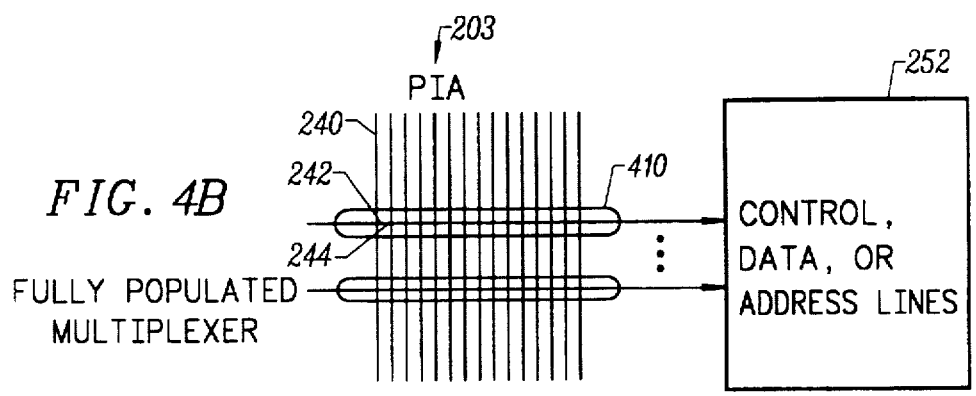
FIG. 4B is a diagram showing interconnections between a programmable interconnect array and a first-in, first-out memory block of the programmable logic device integrated circuit using fully populated multiplexing.

In the embodiment shown in FIG. 4B, signals from PIA 203 of PLD 121 are programmably connectable to the control (259), data (263), or address (265) inputs of FIFO 252. There are one or more programmable connection paths 410 from PIA 203 to control (259), data (263), or address (265) lines of FIFO 252. PIA 203 has vertical conductors 240 and horizontal conductors 242. Vertical and horizontal conductors are programmably connectable at intersections 244 of these two conductors. Furthermore, connections 410 are from a fully populated multiplexer, which means that every signal (vertical conductor) in PIA 303 is connectable to horizontal conductor 244 to control inputs to FIFO 252. For example, a LAB 201 may be programmably connected through PIA 203 to control (259), data (263), and address (265) inputs to FIFO 252. Specifically, an output 213 of LAB 201 is programmably coupled to a vertical conductor 240 of PIA 203. This vertical conductor 240 is programmably coupled at intersection 242 to a vertical conductor 244 to control (259), data (263), and address (265) lines of FIFO 252.

Figure 4C:
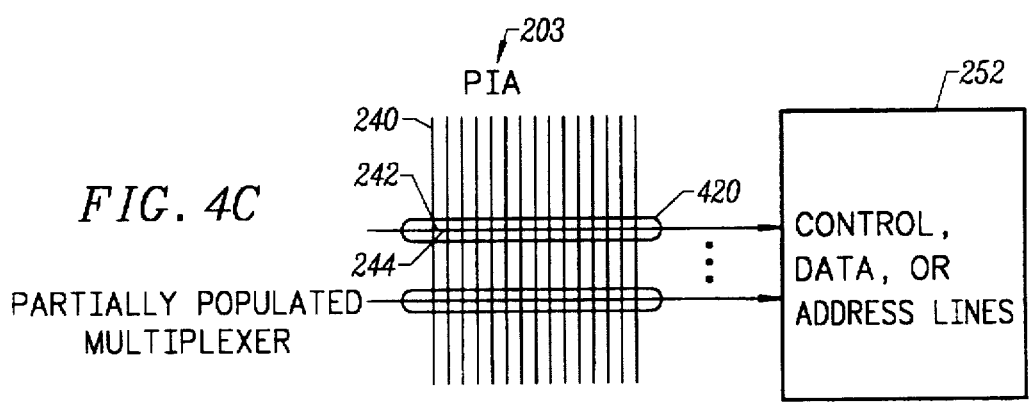
FIG. 4C is a diagram showing interconnections between a programmable interconnect array and a first-in, first-out memory block of the programmable logic device integrated circuit using partially populated multiplexing.

The embodiment shown in FIG. 4C is similar to that shown in FIG. 4B. A difference is there is a partially populated multiplexer 420 for connecting vertical conductors 240 of PIA 203 to horizontal conductors 242. Partially populated multiplexer 420 only allows selected vertical conductors 410 in PIA 203 to be programmably coupled to FIFO 252. For example, in one embodiment, only a selection three of the vertical conductors 410 may be programmably coupled to connections 405. Partially populated multiplexing required fewer programmable connections than fully populated multiplexing. Therefore, partially populated multiplexing results in reduced integrated circuit die sizes.

Figure 4D:
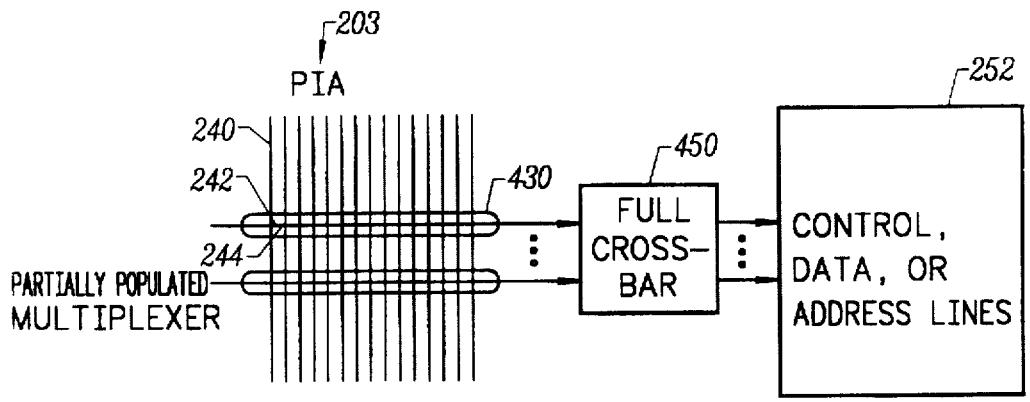
FIG. 4D is a diagram showing interconnections between a programmable interconnect array and a first-in, first-out memory block of the programmable logic device integrated circuit using partially populated multiplexing and crossbar.

The embodiment shown in FIG. 4D has similarities to FIG. 4C. A partially populated multiplexer 430 programmably connects vertical conductors 240 of PIA 203 to a full crossbar switch 450. Crossbar switch 450 is a switch that programmably connects one of its inputs, horizontal conductors 244, to one of the control (259), data (263), and address (265) lines of FIFO 252. Crossbar switch gives greater flexibility in permitting a horizontal conductor 244 to programmably connect to many different FIFO 252 inputs.

Figure 5:
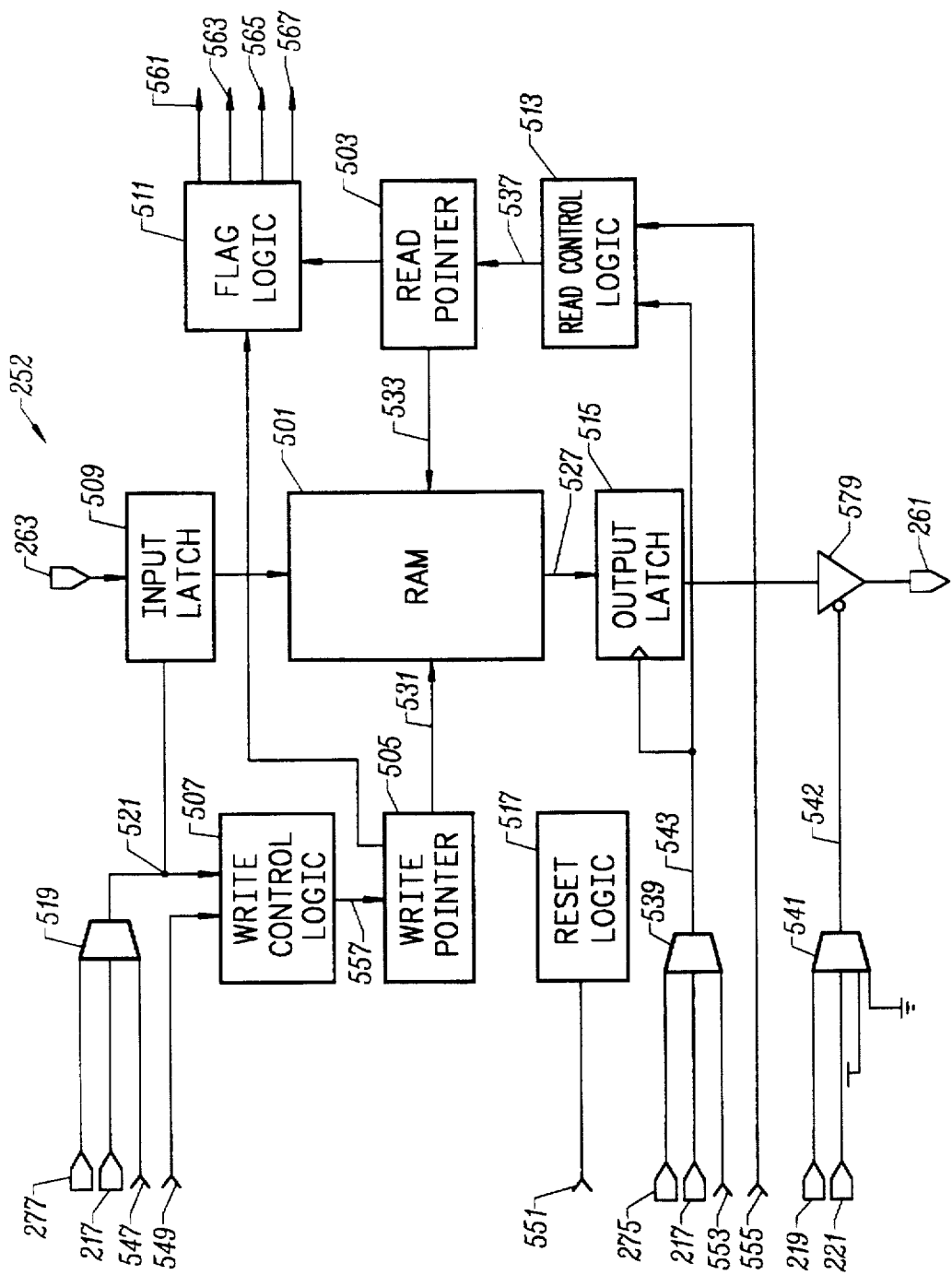
FIG. 5 is a more detailed block diagram of a first-in, first out memory block of the programmable logic device integrated circuit of FIG. 2.

FIG. 5 is a more detailed block diagram of FIFO 252 of FIG. 2. FIFO 252 includes a RAM 501, which is a random access memory for storing data. In other embodiments, RAM 501 may be contained in separate components. Many technologies can be used for the RAM cells including, among others, dynamic- and static-type memory cells such as DRAM, SRAM, EPROM, and EEPROM.

In a specific embodiment, RAM 501 is organized as an array of SRAM cells arranged 1024-words deep by 10-bits wide. Furthermore, the memory organization of the FIFO may be altered as desired by programmably configuring the PLD. For example, by programmably configuring the logic coupled to the address inputs of FIFO 252, the FIFO 252 may be organized 512-words deep by 20-bits wide. Hence, the FIFO may be organized as desired by programmably configuring the PLD. This variable organization feature allows the integrated circuit to be best adapted for a particular application.

As discussed above, FIFO 252 functions as a first-in, first-out memory. Therefore, data are stored in and retrieved from RAM 501 in a first-in, first-out manner. Addressing of RAM 501 to provide FIFO functionality is accomplished using write pointer 505, which is coupled to a write address bus 531 of RAM 501, and read pointer 503, which is coupled to a read address bus 533 of RAM 501. Addresses for reading (or retrieving) data are provided by read pointer 503 and addresses for writing (or storing) data are provided by write pointer 505. Read pointer 503 and write pointer 505 are latches, or registers in other embodiments, for holding the memory addresses for the reading and writing of data. Read pointer 503 and write pointer 505 are updated with new addresses after store and retrieve operations.

A write control block 507 is coupled to write pointer 505 and a read control block 513 is coupled to read pointer 503. Write control block 507 controls the operation of write pointer 505 via control line 557. Read control block 513 controls the operation of read pointer 503 via control line 537. In operation, write and read control logic blocks 507 and 513 implement a FIFO memory organization by determining and updating the addresses in read pointer 503 and write pointer 507 each time data is stored or retrieved. For example, read pointer 503 points to a particular address location in RAM 501. After an item is retrieved from RAM 501, this item is no longer supposed to be in the FIFO. To account for this, responsive to control signal 537, read pointer 503 is incremented (or decremented in other embodiments) to the next address location holding valid data. Similarly, after a write operation, responsive to signal 557, write pointer 507 is similarly incremented, decremented, or adjusted to the next open address location in RAM 501.

Data are stored into RAM 501 using input bus 263 of FIG. 2. From input bus 263, data are first stored into an input latch 509, which is coupled to input bus 525 of RAM 501. Then, input latch 509 is clocked and data may be written into RAM 501 at the address location place on write address bus 531. Input latch 509 may be programmed to operate in one of five clocking modes: leading-edge-triggered register, trailing-edge-triggered register, active-high latch, active-low latch, or as a direct combinatorial bypass. This feature allows more flexibility in how data is input into RAM 501.

In leading-edge-triggered register mode, input latch 509 will function as a register, which will be responsive to a leading edge of a clock input. In trailing-edge-triggered register mode, input latch 509 will function as a register, which will be responsive to a falling edge of a clock input. In active-high latch mode, latch 509 will function as a latch, latching data which its clock input is a high. In active-low latch mode, latch 509 will function as a latch, latching data when its clock input is a low. In direct combinatorial bypass mode, latch 509 will pass data through without any clocking; in this mode, latch 509 becomes transparent.

Data (from the address location placed on read address bus 533) is clocked out of RAM 501 through output latch 515, which is coupled to output bus 527 of RAM 501. Output latch 515 is also programmable to operate in one of the five clocking modes described above for input latch 509. Output latch 515 is coupled to output bus 261 through tristate buffer 579. When tristate buffer 579 is enabled, output data from latch 515 can be transferred onto output bus 261. In the alternative, when tristate buffer 579 is disabled, output bus 261 will be in a high-impedance state (tristate).

Multiplexer 541 programmably selects the output enable control signal 542 coupled to tristate buffer 579. Programmable selection of multiplexer 541 is controlled by way of user-programmable memory bits such as EEPROM cells. Depending on the state of such user-programmed bits, an appropriate output enable signal 542 for tristate buffer 579 is selected. Multiplexer 541 can permanently enable or disable output 261 by programmably connecting the output enable input 542 of tristate buffer 579 to ground or VCC, respectively. Furthermore, output enable 542 can be driven by global output enable signals 219 or 221.

Multiplexer 519 programmably selects a clock signal 521 for input latch 509 and write logic 507. Programmable selection of multiplexer 519 is controlled by way of user-programmable memory bits such as EEPROM cells. Multiplexer 519 can programmably select MEMCLK1 277, global clock 217, or a signal 547 from PIA 203 as clock signal 521. MEMCLK1 277 and global clock 217 were described earlier. As for signal 547, a signal programmably connectable to PIA 203 may used to generate signal 547. For example, via PIA 203, a LAB 201 may be used to generate signal 547.

Multiplexer 539 programmably selects as a clock signal 543 for output latch 515 and read control logic 513. Programmable selection of multiplexer 539 is controlled by way of user-programmable memory bits such as EEPROM cells. Multiplexer 519 can programmably select MEMCLK0 275, global clock 217, or a signal 553 from PIA 203. MEMCLK0 275 and global clock 217 were described earlier. As for signal 553, a signal programmably connectable to PIA 203 may used to generate signal 553. For example, via PIA 203, a LAB 201 may be used to generate signal 553.

Clocking signals 521 and 543 are used to clock data into input latch 509 and output latch 515, respectively. Clock signals 512 are also used to synchronize write control logic 507 and read control logic 513 to the clocking input latch 509 and output latch 515, respectively.

Furthermore, five control inputs control the operation of FIFO 252. These five control inputs are enable write (ENW) 549, enable read (ENR) 535, clear (CLR) 551, write clock (CKW) 521, and read clock (CKR) 543. CKW 521 and CKR 543 are the clock signals generated by multiplexer 519 and multiplexer 539, respectively, which were described above.

ENW 549 is coupled to write control logic 507 and comes from PIA 203 (shown as control signal 259 in FIG. 2). A signal programmably connectable to PIA 203 may generate ENW 549. For example, a LAB 201 may generate ENW 549. ENW 549 enables the writing of data into RAM 501. Moreover, ENW 549 causes write control logic 507 to update write pointer 505 to the next memory location to be written in RAM 501 at the proper clock cycle of clock signal 521.

ENR 555 is coupled to read control logic 513 and comes from PIA 203 (shown as control signal 259 in FIG. 2). A signal programmably connectable to PIA 203 may generate ENR 555. For example, a LAB 201 may generate ENR 555. ENR 555 enables the reading of data from RAM 501. Moreover, ENR 555 causes read control logic 513 to update read pointer 503 to the next memory location to be read at the proper cycle of clocking signal 543.

CLR 551 is coupled to reset logic block 517 and comes from PIA 203 (shown as control signal 259 in FIG. 2). Any signal programmably connectable to PIA 203 may generate CLR 551. For example, a LAB 201 may generate CLR 551. Reset logic 517 is coupled (not shown) to write pointer 505, write control logic 507, read pointer 503, and read control logic 513. Responsive to CLR 551, reset logic 517 resets and clears the FIFO control blocks and pointers. In one embodiment, upon powering up of the PLD integrated circuit, reset logic 517 provides a power-on reset of FIFO control blocks and pointers.

FIFO 252 may be used in an asynchronous mode by strobing data into the FIFO using control inputs, such as ENW 549 and ENR 555. FIFO 252 may also be used in a synchronous mode by using the ENW 549, ENR 555, and one of the clock inputs to clock data into the FIFO. By allowing both asynchronous and synchronous operation, the programmable logic device and FIFO of the present invention may be configured and used in many applications.

FIFO 252 has a flag logic block 511 which produces flags that provide status information for the PLD. Flags have two states, true or false. A flag is true when the status condition they represent occurs, otherwise a flag will be false. In other embodiments of the present invention, the flags may be also be active low. In one embodiment, flag logic block 511 generates flag signals to indicate the status of the FIFO during FIFO mode. As shown in FIG. 5, flag logic block 511 takes inputs from read pointer 503 and write pointer 523 to determine the status of the FIFO. There can be any number of flags. In the embodiment of FIG. 5, there are four flags, full flag 561, almost full flag 563, almost empty flag 565, and empty flag 567.

Full flag 561 is true when the FIFO is full, which occurs when RAM 501 has no empty memory locations available for storing data. For example, an indication of a full FIFO may occur when write pointer 505 points to a memory address in the RAM which is a last available address location in RAM 501. Another technique to determine whether the FIFO is full is when a difference between the addresses in the write address pointer and read address pointer is equal to or exceeds the maximum number of locations in the FIFO. These are just a few of the techniques, among many others, to determine whether the FIFO is full. The logic of a PLD may use full flag 561 for a multitude of purposes: For example, when full flag 561 is true, the PLD may begin to flush the FIFO of its data.

Almost full flag 563 is true when RAM 501 has only a specified number of empty memory locations remaining available for data storage. This specified number may be user-selected by programming memory cells with this number. For example, a user may select four as the specified number empty memory locations. The user programs this number, which may be represented in binary, into the PLD. The specified number may be stored in, for example, nonvolatile EEPROM or Flash EEPROM cells coupled to the write control logic. This specified number may also be reprogrammed as desired, possibly through in-system programming during the operation of the PLD. Almost full flag 563 is true when the specified number of empty memory locations is exceeded (e.g., four or fewer empty memory locations remain).

Almost full flag 563 is useful for a multitude of different applications. For example, almost full flag 563 may be used as an early indicator that the FIFO is becoming full. As a further example, a user may use the FIFO to store incoming data having a width greater than that for a single memory cell of the RAM. Then, the incoming data will be stored in memory locations, which may be consecutive. For example, if the incoming data is 20-bits wide, and the FIFO is 10-bits wide, then a byte of the incoming data may be stored in two memory locations in the RAM. Consequently, the full flag 561 may not accurately represent whether the FIFO is full. In this case, programmable almost full flag 563 could be programmed to more accurately reflect whether the FIFO is full.

Empty flag 567 is true when the FIFO is empty, which occurs when no data is stored in RAM 501. For example, an indication of an empty FIFO may occur when write pointer 505 points to a memory address in the RAM which is a first available address location in RAM 501. Another indication of an empty FIFO is when write address pointer 505 points to the same location as the read address pointer 503. These are just a few of the techniques, among many others, which may be used to determine whether the FIFO is empty.

Empty flag 567 may be used in to implement the logic of the programmable logic device. For example, when empty flag 567 is true, the PLD logic should not allow attempts to read any data from the FIFO.

Almost empty flag 565 is true when RAM 501 has only a specified number of memory locations already filled with data. Analogous to almost full flag 563, almost empty flag 565 is also user-programmable. For example, a user may select four as the specified number of occupied memory locations. The user programs this number in the PLD. Almost empty flag 565 is true when the specified number of occupied memory locations is exceeded (e.g., four or fewer occupied memory locations). Almost empty flag 565 may be used to create the desired logical functions for many different applications.

In a preferred embodiment, the flag signals of the present invention are routed to PIA 203 of FIG. 2 (shown as connection 276), so they may be connected to LABs 201 and LEs to drive the PLD's logic functions. Flag signals may be routed to any input-output pad 209 through PIA 203 and a LAB 201.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A first-in, first-out memory block for a programmable logic device comprising:

at least one random access memory;

a first clock signal, programmably coupled to synchronize a logic block of said programmable logic device and said at least one random access memory;

a read pointer latch, coupled to a read address input of said at least one random access memory; and a write pointer latch, coupled to a write address input of said at least one random access memory.

2. The first-in, first-out memory block of claim 1 further comprising:

a read control block, coupled to said read pointer latch and enabled by a control signal from a logic block of said programmable logic device; and a write control block, coupled to said write pointer latch.

3. The first-in, first-out memory block of claim 1 further comprising:

a reset logic block, coupled to said write pointer latch and said read pointer latch, wherein said reset logic block resets said write pointer latch and said read pointer latch.

4. A first-in, first-out memory block for a programmable logic device comprising:

at least one random access memory;

a first clock input from a programmable interconnect array of said programmable logic device;

a second clock input, programmably coupled to a logic block of said programmable logic device;

an input latch, wherein an output of said input latch is coupled to a data input of said at least one random access memory;

an output latch, wherein an input of said output latch is coupled to a data output of said at least one random access memory; and an input clock multiplexer, selectively coupling said first clock input or said second clock input to synchronize said input latch.

5. The first-in, first-out memory block of claim 4 wherein said input latch is programmably configurable as a leading-edge-triggered register.

6. The first-in, first-out memory block of claim 4 wherein said input latch is programmably configurable as an active-low latch.

7. The first-in, first-out memory block of claim 4 wherein said input latch is programmably configurable as a direct combinatorial bypass.

8. The first-in, first-out memory block of claim 4 further comprising:

an output clock multiplexer, selectively coupling said first clock input or said second clock input to synchronize said output latch.

9. The first-in, first-out memory block of claim 4 further comprising:

a tristate buffer, coupled to an output of said output latch, wherein an output of said tristate buffer is coupled to an input-output pad of said programmable logic device and said tristate buffer is controlled by an output enable signal, whereby said output enable signal also controls input-output blocks of said programmable logic device.

10. A first-in, first-out memory block for a programmable logic device comprising:

a memory, storing data for said first-in, first-out memory block; and a flag logic block, generating a plurality of control flags indicating a status of said first-in, first-out memory block, wherein said plurality of control flags is programmably coupled to a programmable interconnect array of said programmable logic device.

11. The first-in, first-out memory block of claim 10 wherein said flag logic block generates a FULL control flag, indicating memory locations are not available for storing data in said first-in, first-out memory.

12. The first-in, first-out memory block of claim 10 wherein said flag logic block generates an ALMOST FULL control flag, indicating less than a specified number of memory locations are available for storing data in said first-in, first-out memory.

13. The first-in, first-out memory block of claim 10 wherein said flag logic block generates an ALMOST EMPTY control flag, indicating more than a specified number of memory locations are storing data in said first-in, first-out memory.

14. The first-in, first-out memory block of claims 12 or 13 wherein said specified number of memory locations is user selectable by configuring said programmable logic device.

15. The first-in, first-out memory block of claim 10 wherein said flag logic block generates an EMPTY control flag, indicating memory locations are not used for storing data in said first-in, first-out memory.

16. The first-in, first-out memory block of claim 10 wherein said plurality of control flags may be programmably coupled through said programmable interconnect array to logic elements of said programmable logic device.

17. A programmable logic device comprising:
a plurality of logic elements configurable to perform logical functions;
a programmable interconnect array configurable to interconnect signals between said logic elements; and
a first-in, first-out memory module comprising:
a plurality of flags indicating status information of said first-in, first-out memory module, wherein said plurality of flags may be programmably coupled through said programmable interconnect array to drive logic of said programmable logic device.

18. The programmable logic device of claim 17 wherein said first-in, first-out memory module is dual-ported.

19. The programmable logic device of claim 17 wherein said first-in, first-out memory module further comprises:
a data input port through which external data is transferred into said first-in, first-out memory; and
a data output port through which data is transferred from said first-in, first-out memory externally.

20. A programmable logic device comprising:
a plurality of logic elements configurable to perform logical functions;
a programmable interconnect array configurable to interconnect signals between said logic elements; and
a first-in, first-out memory module, wherein one of said plurality of logic elements is programmably coupled to drive a control input of said first-in, first-out memory module.

21. The programmable logic device of claim 20 wherein said one of said plurality of logic elements directly drives said control input.

22. The programmable logic device of claim 20 wherein said control input is an ENABLE WRITE control for controlling writing of data into said first-in, first-out memory module.

23. The programmable logic device of claim 20 wherein said control input is an ENABLE READ control for controlling reading of data from said first-in, first-out memory module.

24. The programmable logic device of claim 20 wherein said control input is a CLEAR control for resetting control logic within said first-in, first-out memory module.

25. A programmable logic device comprising:
a programmable interconnect array configurable to interconnect signals between a plurality of configurable logic elements; and
a first-in, first-out memory block, generating an ALMOST FULL flag, user-programmable to indicate a number of unoccupied memory locations in said first-in, first-out memory, wherein said ALMOST FULL flag may be programmably coupled to said programmable interconnect array.

26. The programmable logic device of claim 25 wherein said ALMOST FULL flag is FALSE when said number of unoccupied memory locations exceeds a user-selected value.

27. A programmable logic device comprising:
a programmable interconnect array configurable to interconnect signals between a plurality of configurable logic elements; and
a first-in, first-out memory block, generating an ALMOST EMPTY flag, user-programmable to indicate a number of occupied memory locations in said first-in, first-out memory, wherein said ALMOST EMPTY flag may be programmably coupled to said programmable interconnect array.

28. The programmable logic device of claim 27 wherein said ALMOST EMPTY flag is FALSE when said number of occupied memory locations exceeds a user-selected value.

29. The programmable logic device of claims 26 or 28 wherein said user-selected value is stored in said programmable logic device using electrically erasable programmable read only memory cells.

30. A programmable logic device comprising:
a plurality of logic elements;
a programmable interconnect array configurable to interconnect signals between said plurality of logic elements;
a first-in, first-out memory, programmably coupled to said programmable interconnect array; and
a clock signal, wherein at least one of said plurality of logic elements and said first-in, first-out memory are synchronized to said clock signal.

31. The programmable logic device of claim 30 wherein said clock signal is provided through said programmable interconnect array.

32. A programmable logic device comprising:
a plurality of logic elements configurable for performing logical functions;
a plurality of input-output blocks, wherein signals from said plurality of logic elements may be output through said plurality of input-output blocks;
a programmable interconnect array configurable to interconnect signals between said plurality of logic elements; and;
a first-in, first-out memory block, programmably coupled to said plurality of logic elements.

33. The programmable logic device of claim 32 further comprising:
an output enable signal, whereby output from at least one of said plurality of input-output blocks and said first-in, first-out memory are controlled by said output enable signal.

34. The programmable logic device of claim 32 wherein said plurality of logic element are programmably coupled through said programmable interconnect array to said first-in, first-out memory.

35. The programmable logic device of claim 32 wherein signals from said programmable interconnect array are coupled to control inputs of said first-in, first-out memory.

36. The programmable logic device of claim 35 wherein one of said control inputs of said first-in, first-out memory is an enable read input.

37. The programmable logic device of claim 35 wherein one of said control inputs of said first-in, first-out memory is an enable write input.

38. The programmable logic device of claim 35 wherein one of said control inputs of said first-in, first-out memory is a clear input.

39. The programmable logic device of claim 35 wherein one of said control inputs of said first-in, first-out memory is a write clock input.

40. The programmable logic device of claim 35 wherein one of said control inputs of said first-in, first-out memory is a read clock input.

41. The programmable logic device of claim 32 wherein signals from said programmable interconnect array are coupled to address inputs of said first-in, first-out memory.

42. The programmable logic device of claim 32 wherein signals from said programmable interconnect array are coupled to data inputs of said first-in, first-out memory.

43. The programmable logic device of claim 32 wherein said first-in, first-out memory generates flag outputs programmably coupled to said programmable interconnect array.

44. The programmable logic device of claim 32 wherein a memory organization of said first-in, first-out memory is configurable in a first mode, having a first number of bits width and a second number of bits depth, and in a second mode, having a third number of bits width, half said first number of bits width, and a fourth number of bits depth, twice said second number of bits depth.

45. The programmable logic device of claim 32 wherein said programmable logic device is configurable by in-system programming.

46. A programmable logic device comprising:

a plurality of logic elements configurable for performing logical functions;

a plurality of input-output blocks, wherein signals from said plurality of logic elements may be output through said plurality of input-output blocks;

a programmable interconnect array configurable to interconnect signals between said plurality of logic elements; and;

a first-in, first-out memory, programmably coupled to said plurality of logic elements, wherein said first-in, first-out memory generates a plurality of control flags programmably coupled to said programmable interconnect array, and signals from said programmable interconnect array are programmably coupled to control inputs of said first-in, first-out memory.

47. The programmable logic device of claim 46 wherein said plurality of control flags includes at least one user-programmable control flag.

* * * * *